United States Patent
Ferwalt

(10) Patent No.: US 7,164,319 B2
(45) Date of Patent: Jan. 16, 2007

(54) POWER AMPLIFIER WITH MULTI MODE GAIN CIRCUIT

(75) Inventor: Darren W. Ferwalt, Hillsboro, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 85 days.

(21) Appl. No.: 11/117,828

(22) Filed: Apr. 29, 2005

(65) Prior Publication Data

US 2006/0244535 A1    Nov. 2, 2006

(51) Int. Cl.
*H03G 3/10* (2006.01)

(52) U.S. Cl. ............................... 330/285; 330/296

(58) Field of Classification Search ........... 370/285, 370/296, 297, 310, 98, 150
See application file for complete search history.

(56) References Cited

U.S. PATENT DOCUMENTS

| | | | |
|---|---|---|---|
| 3,899,643 A * | 8/1975 | Tabalba | 379/395 |
| 4,016,502 A * | 4/1977 | Heinz et al. | 330/302 |
| 5,389,896 A | 2/1995 | Kobayashi | |
| 6,064,261 A * | 5/2000 | Stein et al. | 330/252 |
| 6,242,986 B1 | 6/2001 | Adar | |
| 6,636,114 B1 | 10/2003 | Tsutsui et al. | |
| 6,693,492 B1 | 2/2004 | Desize | |
| 6,724,252 B1 | 4/2004 | Ngo et al. | |
| 2003/0218500 A1 | 11/2003 | Yamamoto et al. | |
| 2004/0012445 A1 | 1/2004 | Numanami et al. | |

* cited by examiner

*Primary Examiner*—Henry Choe
(74) *Attorney, Agent, or Firm*—Schwabe, Williamson & Wyatt

(57) ABSTRACT

A power amplifier comprises an input terminal, an output terminal and a first amplification stage coupled with the input and output terminals. The first amplification stage having a node and a resistive structure coupled with the node. The resistive structure includes a first resistive circuit coupled with the node; and an adaptation circuit coupled with the first resistive circuit such that when the first amplification stage is in a first mode, the resistive structure provides a first effective resistance and when the first amplification stage is in a second mode, the resistive structure provides a second effective resistance.

23 Claims, 3 Drawing Sheets

POWER AMPLIFIER WITH MULTI MODE GAIN CIRCUIT

TECHNICAL FIELD

Embodiments of the present invention relate generally to the field of circuit design, in particular, the design of power amplifier related circuits.

BACKGROUND

Various devices utilize radio frequencies (RF) to transmit information. For example, handheld devices such as mobile phones and laptops may be utilized to transmit voice and/or data. These devices contain different modules for performing different aspects of the voice or data transmissions. Frequently these devices will contain a power amplification module to amplify a radio frequency signal from a relatively low power signal to a signal of appropriate power for transmission. Power amplification modules may be single or multiple stage devices.

Devices utilizing radio frequencies to transmit voice or data may be under an obligation to adhere to various standards. Early communications devices that were to transmit on first generation analog networks in the United States, for example, were required to adhere to the Advanced Mobile Phone System (AMPS) standard. Second generation standards include Global System for Mobile phone communication (formerly Groupe Speciale Mobile—GSM), Time Division Multiple Access (TDMA) and IS-95. Enhanced second generation standards include General Packet Radio System (GPRS) for sending packet data in GSM systems. Other standards, such as 2.5 generation standards and third generation standards may provide greater bandwidth than the second generation system. An example of a 2.5 generation standard is Enhanced Data Rates for GSM evolution (EDGE). Examples of third generation standards include Wideband Code Division Multiple Access (WCDMA), and CDMA2000. These are just a sample of the variety of standards that have been proposed and/or established for radio frequency communication.

BRIEF DESCRIPTION OF THE FIGURES

Embodiments of the present invention are illustrated in the accompanying drawings. The accompanying drawings, however, do not limit the scope of the present invention. Similar references in the drawings indicate similar elements.

DETAILED DESCRIPTION OF THE EMBODIMENTS

In the following description, various embodiments of the invention will be described. However, it will be apparent to those skilled in the art that the invention may be practiced with only some or all features described in various embodiments of the invention. For purposes of explanation, specific numbers, materials and configurations are set forth in order to provide a thorough understanding of these embodiments. However, it will also be apparent to one skilled in the art that embodiments of the invention may be practiced without the specific details. In other instances, well-known features are omitted or simplified in order not to obscure the invention.

Figure 1:
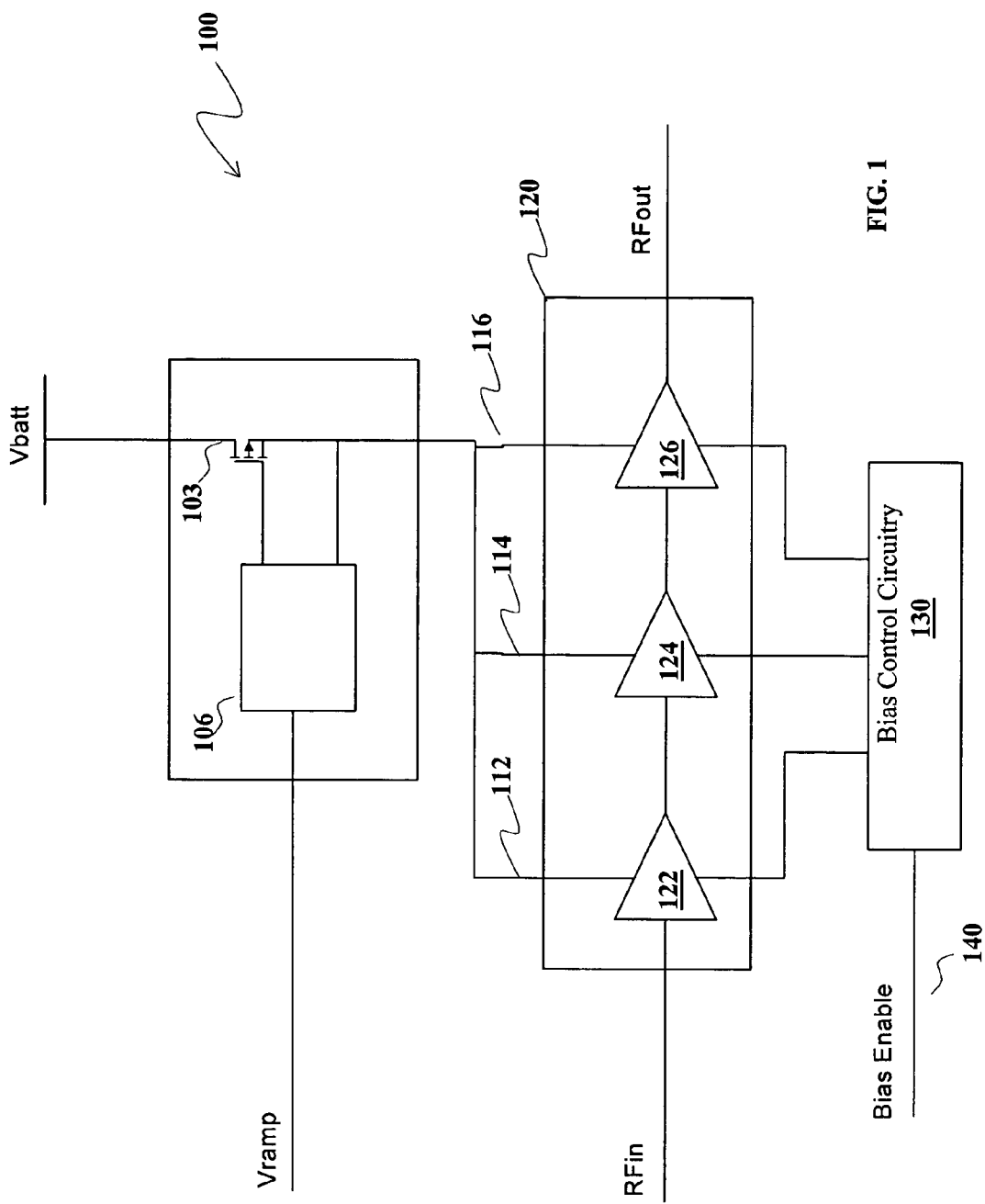
FIG. 1 illustrates a multistage amplifier in accordance with one embodiment of the invention.

FIG. 1 illustrates a multistage amplifier in accordance with one embodiment of the application. The multistage amplifier may comprise power control circuitry 110, amplifier circuitry 120 and bias control circuitry 130. Power control circuitry 110 provides appropriate power via power supply lines 112–116 to the amplifier stages 122–126. In one embodiment, the power control circuitry 110 may utilize a three stage collector control, as illustrated in FIG. 1. For example, a P-Type Metal Oxide Semiconductor Field Effect Transistor (P-MOSFET) device 103 may be utilized with a feedback loop 106 to control the power to amplifier stages 122–126. Bias control circuitry 130 provides proper bias to the amplifier stages 122–126 when enabled by the bias enable signal 140. Amplifier circuitry 120 may comprise three amplifier stages 122–126.

Figure 2:
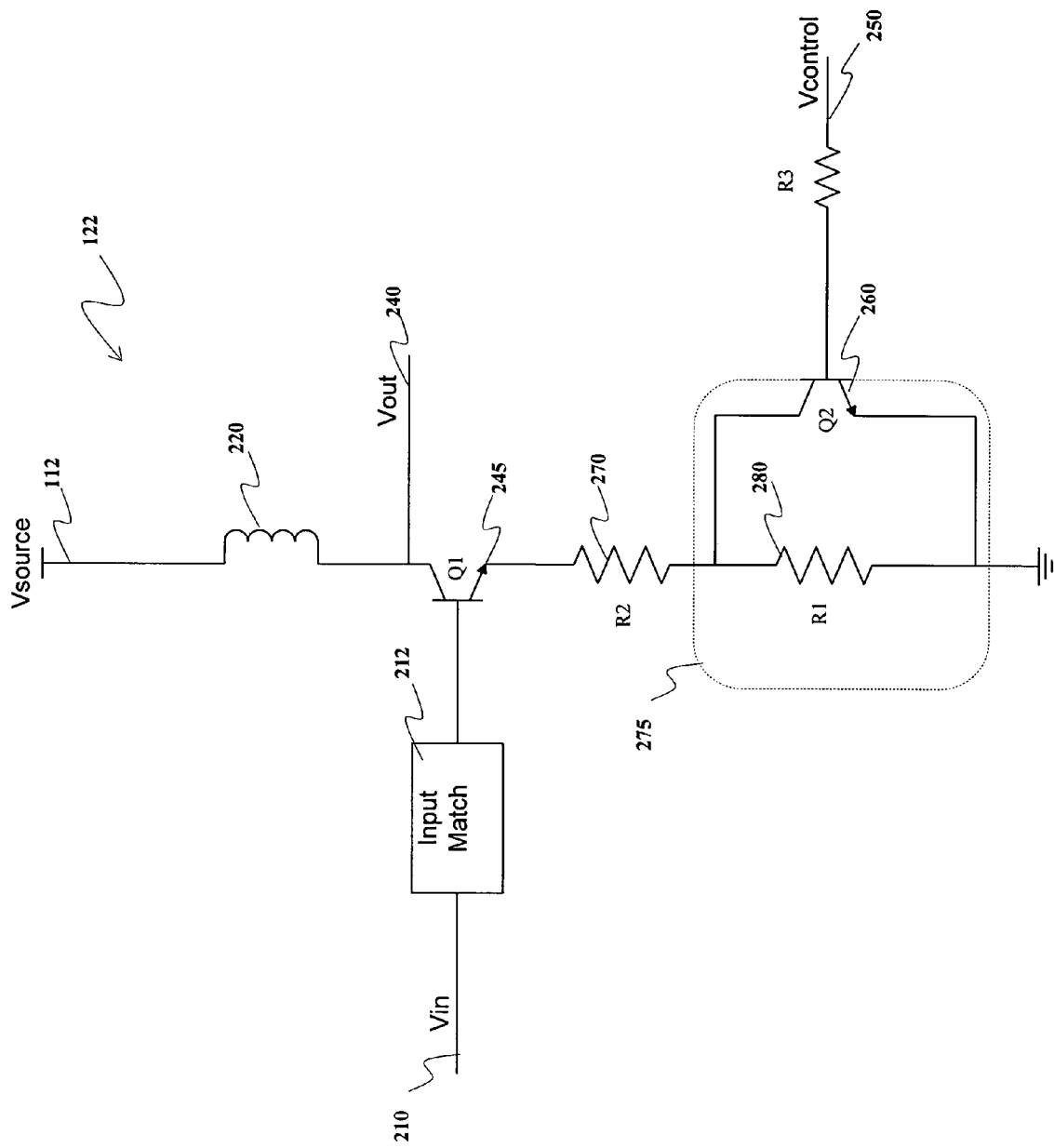
FIG. 2 illustrates an amplification stage in accordance with one embodiment.

FIG. 2 illustrates an amplification stage 122 in accordance with one embodiment. Vin 210 is an input to the amplification stage 122. In the embodiment illustrated, input matching circuitry 212 provides termination to match the source impedance associated with input signal Vin 210. In the embodiment illustrated, L1 220 provide an RF choke to supply Vsource 112. The output signal, Vout 240, is provided to the next amplification stage, e.g. 124.

Variable emitter resistance may be utilized to influence the gain of the amplification stage 122. By providing an ability to provide for various modes of effective resistance seen by the Q1 emitter node 245, various gains may be established for the amplification stage 122. Thus, in a first mode of operation of the amplification stage 122, a first effective resistance may be seen by the Q1 emitter node 245. In a second mode of operation of the amplifier stage 122, a second effective resistance may be seen by the Q1 emitter node 245.

For example, in the embodiment illustrated, in a first mode of operation of the stage, an adaptation circuit having e.g. transistor Q2 260, may be on. This mode may correspond to a voltage on Vcontrol 250 that enables transistor Q2 260, and drives transistor Q2 260 into saturation. In such a mode, the on-resistance of the transistor Q2 260 is low. Thus, the effective resistance seen by the Q1 emitter node 245 may be the resistance of R2 270, for example 3 ohms, plus the resistance of resistive structure 275. This effective resistance corresponds to the parallel combination of the resistance of R1 280, for example 30 ohms, and the on-resistance of Q2 260. The on-resistance of Q2 260 may be sufficiently low (e.g. less than an ohm) such that the effective resistance seen by the Q1 emitter node 245 is essentially the 3 ohms of R2 270. This may result in the amplifier stage 122 providing a first gain in the first mode. This first mode may correspond to, for example, a GSM mode of operation. In such a case, the non-linearity of transistor Q2's conduction may not have deleterious effects on the operation of the amplifier stage, as discussed further below, due to the constant envelope nature of GSM transmission.

In a second mode of operation of the circuit, the transistor Q2 260 may be off. In this mode of operation, the voltage on Vcontrol 250 is at a level that causes the transistor Q2 260 not to conduct, i.e. be in cutoff mode. Thus, in this mode of operation, the resistance seen by the Q1 emitter node 245 is the series combination of R1 280 and R2 270. Utilizing the example resistance values used above, this results in a resistance of 33 ohms. This may provide for a reduced gain for the amplifier stage 122 when compared to the gain of the amplifier stage 122 in the first mode as previously discussed.

A multimode amplification stage, as discussed above, may be useful in the design of various mixed mode devices. For example, the gain of a first amplifier stage in a device transmitting in a GSM mode may require a certain gain. However, the gain of the first amplifier stage in the device transmitting in an EDGE mode may be lower. This may be, for example, to accommodate specification requirements on receive band noise. This above described multimode amplification stage may be utilized to, among other things, reduce or enhance the gain of an amplification stage when in different modes.

In addition, such a design may provide for an amplification that is more linear in nature in the second mode of operation due to the additional series feedback that R1 280 provides. As mentioned, a second mode of operation may correspond, for example, to the operation of an amplifier stage in an EDGE mode. As previously mentioned, GSM utilizes a modulation scheme, Gaussian minimum-shift keying, that maintains a constant RF envelope wherein only the phase of the signal varies in time. In such cases, the linearity of the power amplification may not be overly important in the design of the power amplifiers. In contrast, EDGE transmission utilizes a higher data rate modulation scheme that may have significant envelope variation. This envelope variation may result in the linearity of the power amplification being an important factor in the design of the power amplifiers.

While the embodiments of the application described herein illustrate a three amplifier stage design, other numbers of stages may be utilized. For example, in one embodiment, a two stage amplifier design may be utilized. In another embodiment, a four stage amplifier design may be utilized. In yet another embodiment, the multimode amplifier design of the present application may be utilized in a single stage amplifier design.

In some embodiments, each stage is adapted to provide multiple gains. In other embodiments, one or more stages may be adapted to provide one gain only.

Figure 3:
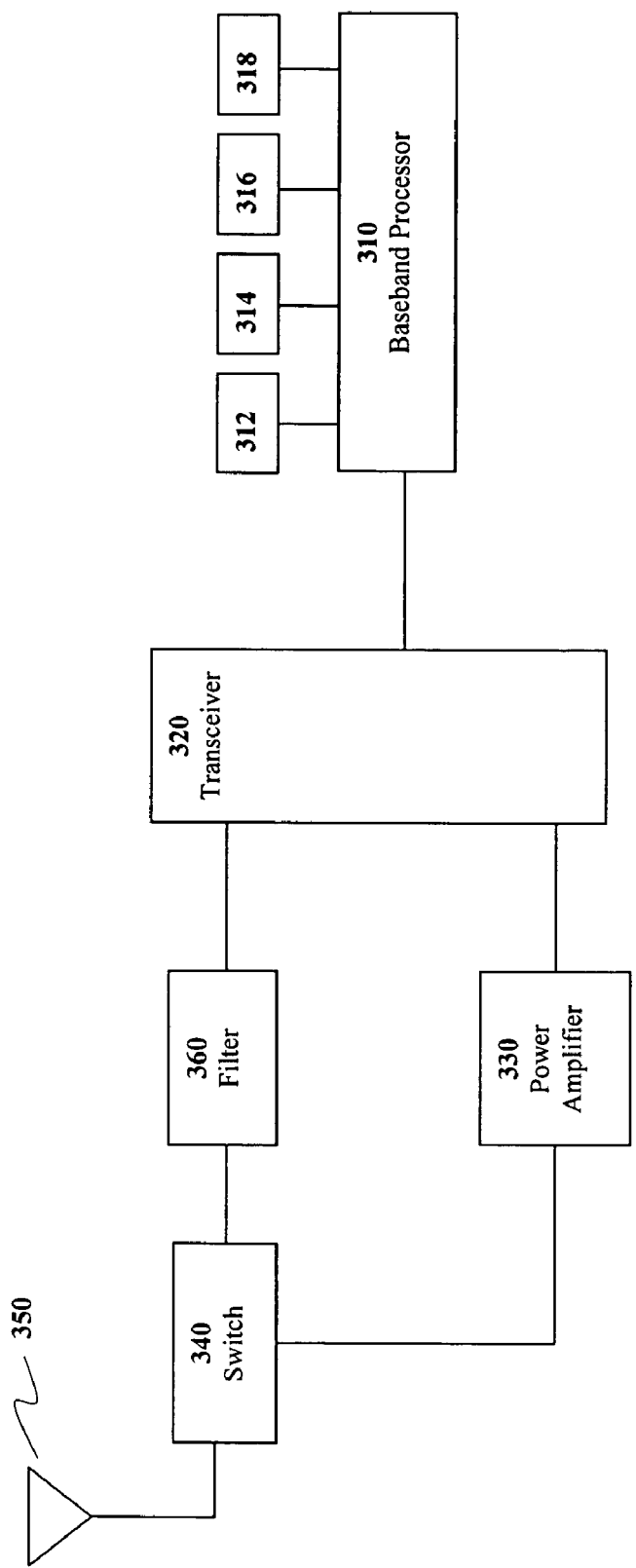
FIG. 3 illustrates an embodiment of a system that includes a power amplifier design of the present application.

FIG. 3 illustrates an embodiment of a system 300 that includes a power amplifier 330 of the present application. Baseband 310 may include a transmit/receive digital signal processor and circuitry for interfacing a speaker 312, microphone 314, keypad 316 and display 318. Baseband processor 310 may be utilized to, among other things, convert data between analog devices and the transmit/receive digital signal processor or perform various operations on digitized voice data such as speech encoding and channel encoding. In various embodiments, separate transmit and receive digital signal processors may be utilized. Baseband processor 310, speaker 312, microphone 314, keypad 316 and display 318 are known to those of ordinary skill in the art, and thus will not be described in detail.

Encoded data is provided to transceiver 320, where the data is modulated with an RF signal. Modulated data may be converted to a frequency of transmission. The RF signal is a small signal that may be amplified by the power amplifier 330 prior to transmission. The power-amplified signal is provided to switch 340 for transmission via antenna 350. A similar, but reverse, path is followed by data received through antenna 350, switch 340 and filter 360. Transceiver 320, switch 340, antenna 350 and filter 360 are known to those of ordinary skill in the art, and thus will not be described in detail.

Thus, it can be seen from the above descriptions, a novel method and apparatus for a multimode amplification has been described. The description is to be regarded as illustrative instead of restrictive on the present invention, which scope is set forth in the claims to follow.

What is claimed is:

1. A power amplifier comprising:
   an input terminal;
   an output terminal;
   a first amplification stage coupled with the input and output terminals, having:
   a node,
   a resistive structure coupled with the node including:
   a first resistive circuit coupled with the node; and
   an adaptation circuit coupled with the first resistive circuit such that when the first amplification stage is in a first mode, the resistive structure provides a first effective resistance and when the first amplification stage is in a second mode, the resistive structure provides a second effective resistance.

2. The power amplifier of claim 1, wherein the first amplification stage further comprises a second resistive structure coupled between the node and the first resistive structure.

3. The power amplifier of claim 1 wherein the first mode is a Global System for Mobile (GSM) mode.

4. The power amplifier of claim 1, wherein the second mode is an Enhanced Data Rates for GSM evolution (EDGE) mode.

5. The power amplifier of claim 1 wherein the adaptation circuit comprises a transistor.

6. The power amplifier of claim 5, wherein the transistor comprises a bipolar junction transistor.

7. The power amplifier of claim 6 wherein the bipolar junction transistor comprises a heterojunction bipolar transistor.

8. The power amplifier of claim 6, wherein the node is coupled with an emitter of the bipolar junction transistor.

9. The power amplifier of claim 1, wherein the first effective resistance is lower than the second effective resistance.

10. The power amplifier of claim 1, wherein the first effective resistance results in a first gain for the first amplification stage and wherein the second effective resistance results in a second gain for the first amplification stage.

11. The power amplifier of claim 1, further comprising a second amplification stage coupled with the first amplification stage, and a selected one of the input and output terminals of the first amplification stage.

12. The power amplifier of claim 11, wherein the second amplification stage is similarly constituted as the first amplification stage, to provide different gains at different modes of operation.

13. An apparatus comprising:
   a power amplifier including:
   an input terminal,
   an output terminal, and
   a first amplification stage coupled with the input and output terminals, having:
   a node,
   a resistive structure coupled with the node including:
   a first resistive circuit coupled with the node, and
   an adaptation circuit coupled with the first resistive circuit such that when the first amplification stage is in a first mode, the resistive structure provides a first effective resistance, and when the first amplification stage is in a second mode, the resistive structure provides a second effective resistance;
   a switch coupled with the power amplifier; and
   an antenna coupled with the switch.

14. The apparatus of claim 13, wherein the adaptation structure comprises a heterojunction bipolar transistor.

15. The apparatus of claim 13, wherein the first effective resistance is lower than the second effective resistance.

16. The apparatus of claim 13, wherein the first mode is a GSM mode.

17. The apparatus of claim 13, wherein the second mode is an EDGE mode.

18. The apparatus of claim 13, wherein the first effective resistance results in a first gain for the first amplification stage and wherein the second effective resistance results in a second gain for the first amplification stage.

19. The apparatus of claim 13, wherein the power amplifier further comprises a second amplification stage coupled with the first amplification stage, and a selected one of the input and output terminals of the first amplification stage.

20. The apparatus of claim 19, wherein the second amplification stage is similarly constituted as the first amplification stage, to provide different gains at different modes of operation.

21. A method of operation in a power amplifier comprising:
   during a first mode of operation, providing a first gain by an amplification stage of the power amplifier, by providing a first effective resistance to the amplification stage, by adapting an adaptable resistive structure to a first adaptation; and
   during a second mode of operation, providing a second gain by the amplification stage, by providing a second effective resistance to the amplification stage, by adapting the adaptable resistive structure to a second adaptation.

22. The method of claim 21, wherein the providing of the first gain is performed while the first mode is in a GSM mode.

23. The method of claim 21, wherein the providing of the second gain is performed while the second mode is in an EDGE mode.

* * * * *